United States Patent
Maeda

(10) Patent No.: US 7,552,006 B2
(45) Date of Patent: Jun. 23, 2009

(54) VEHICLE-USE BATTERY MONITOR APPARATUS

(75) Inventor: Shunichi Maeda, Anjo (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 12/010,630

(22) Filed: Jan. 28, 2008

(65) Prior Publication Data

US 2008/0201055 A1    Aug. 21, 2008

(30) Foreign Application Priority Data

Feb. 15, 2007    (JP)    ............... 2007-034702

(51) Int. Cl.
*H01M 10/44*    (2006.01)
*G06F 19/00*    (2006.01)
*B60Q 11/00*    (2006.01)

(52) U.S. Cl. ............... 701/102; 322/25; 340/441

(58) Field of Classification Search ............... 701/102, 701/101, 115; 322/23, 25, 29; 340/441
See application file for complete search history.

(56) References Cited

U.S. PATENT DOCUMENTS 5,339,018 A * 8/1994 Brokaw ............... 320/147
5,929,609 A * 7/1999 Joy et al. ............... 322/25
7,023,102 B2 * 4/2006 Itoh ............... 290/40 C
7,098,628 B2    8/2006 Maehara et al.

FOREIGN PATENT DOCUMENTS

| JP | A 05-272379 | 10/1993 |
| JP | A 09-107640 | 4/1997 |
| JP | A 2005-192308 | 7/2005 |

* cited by examiner

*Primary Examiner*—Hieu T Vo
(74) *Attorney, Agent, or Firm*—Oliff & Berridge, PLC

(57) ABSTRACT

The vehicle-use battery monitor apparatus includes a first function of receiving a power generation rate indicative of an operating state of a vehicle alternator from a power generation control device, a second function of detecting a charge/discharge current of a vehicle battery, a third function of transmitting the power generation rate to an electronic control unit for controlling an output power of a vehicle engine in order that an idle-up control is performed depending on a value of the power generation rate, a fourth function of increasing the value of the power generation rate when it is determined that the vehicle battery is in a discharge state on the basis of a detection result by the second function, and a fifth function of generating a notification signal in accordance with which an indicator light makes an indication of the power generation rate being increased by the forth function.

12 Claims, 15 Drawing Sheets

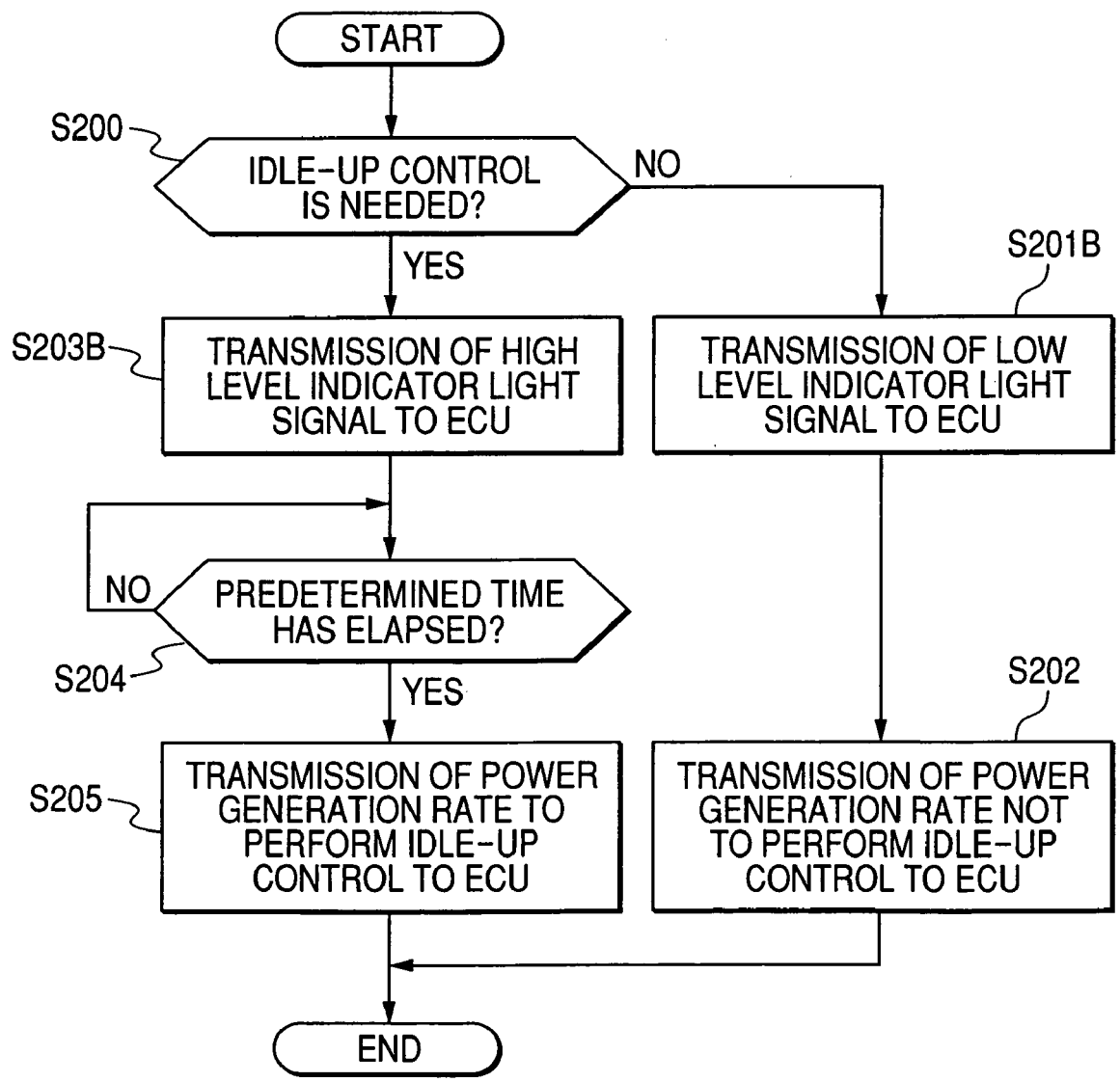

VEHICLE-USE BATTERY MONITOR APPARATUS

CROSS-REFERENCE TO RELATED APPLICATION

This application is related to Japanese Patent Application No. 2007-34702 filed on Feb. 15, 2007, the contents of which are hereby incorporated by reference.

BACKGROUND OF THE INVENTION

1. Field of the Invention

The present invention relates to a vehicle-use battery monitor apparatus for detecting a charging/discharging current of a battery mounted on a vehicle such as a passenger car and a truck.

2. Description of Related Art

There is known a configuration in which a ratio of an energization time to a total time including the energization time and a de-energization time of an exciting coil of a vehicle alternator is calculated to detect the power generation work of the vehicle alternator, and an intake air quantity at idling of a vehicle engine is corrected on the basis of the detected power generation work. For example, refer to Japanese Patent Application Laid-open No. 5-272379 (Patent Document 1).

Also, there is known a configuration in which a gradual-excitation time period is controlled depending on the increase rate of a generator torque to suppress a variation of a battery voltage, an engine output power is corrected depending on the increase rate of the generator torque, and the gradual-excitation time period is shortened after the corrections are completed in order to suppress a variation of an engine speed. For example, refer to Japanese Patent Application Laid-open No. 2005-192308 (Patent Document 2).

Also, there is known a configuration in which a gradual-excitation control is enabled when an electrical load is applied, and the gradual-excitation control is disabled if a battery voltage is excessively lowered to keep the battery voltage within a certain range. For example, refer to Japanese Patent Application Laid-open No. 9-107640 (Patent Document 3).

However, the configuration described in Patent Document 1 has a problem in that a timing of an engine speed increase is delayed when a gradual excitation control is in operation, because, in this configuration, it is judged that there is sufficient margin in a power generation amount of the vehicle alternator when the gradual excitation control is in operation. In addition, although this configuration is able to suppress the variation of the engine speed, it is not able to suppress the variation of the battery voltage.

The configuration described in Patent Document 2 has a problem in that a process load of an engine control unit becomes large, because the engine control unit has to always monitor an engine state, a battery state, an electrical load state, and an alternator state. In addition, since a current sensor is connected to the engine control unit through a long harness routed in an engine room, the engine control unit may malfunction due to ignition noise entering the harness.

The configuration described in Patent Document 3 has a problem in that, since an electrical load state is detected on the basis of the battery voltage in this configuration, a secular variation of an internal resistance of the battery makes it difficult to attain stable control.

SUMMARY OF THE INVENTION

The present invention provides a vehicle-use battery monitor apparatus, comprising:

a first function of receiving a power generation rate indicative of an operating state of a vehicle alternator driven by a vehicle engine mounted on a vehicle from a power generation control device mounted on the vehicle alternator to control an output of the vehicle alternator;

a second function-of detecting a charge/discharge current of a vehicle battery charged by the vehicle alternator;

a third function of transmitting the power generation rate to an electronic control unit for controlling an output power of the vehicle engine in order that an idle-up control is performed depending on a value of the power generation rate;

a fourth function of increasing the value of the power generation rate to be transmitted to the electronic control unit when it is determined that the vehicle battery is in a discharge state on the basis of a detection result by the second function; and a fifth function of generating a notification signal in accordance with which an indicator light makes an indication of the power generation rate being increased by the forth function.

According to the present invention, it is possible to provide a vehicle-use battery monitor apparatus capable of preventing the timing to increase an engine speed from being delayed, and stabilizing the engine speed when a load response control is in operation.

Other advantages and features of the invention will become apparent from the following description including the drawings and claims.

BRIEF DESCRIPTION OF THE DRAWINGS

In the accompanying drawings:

FIG. 20 is a flowchart showing an operation of the battery monitor apparatus show in FIG. 19.

PREFERRED EMBODIMENTS OF THE INVENTION

Figure 1:
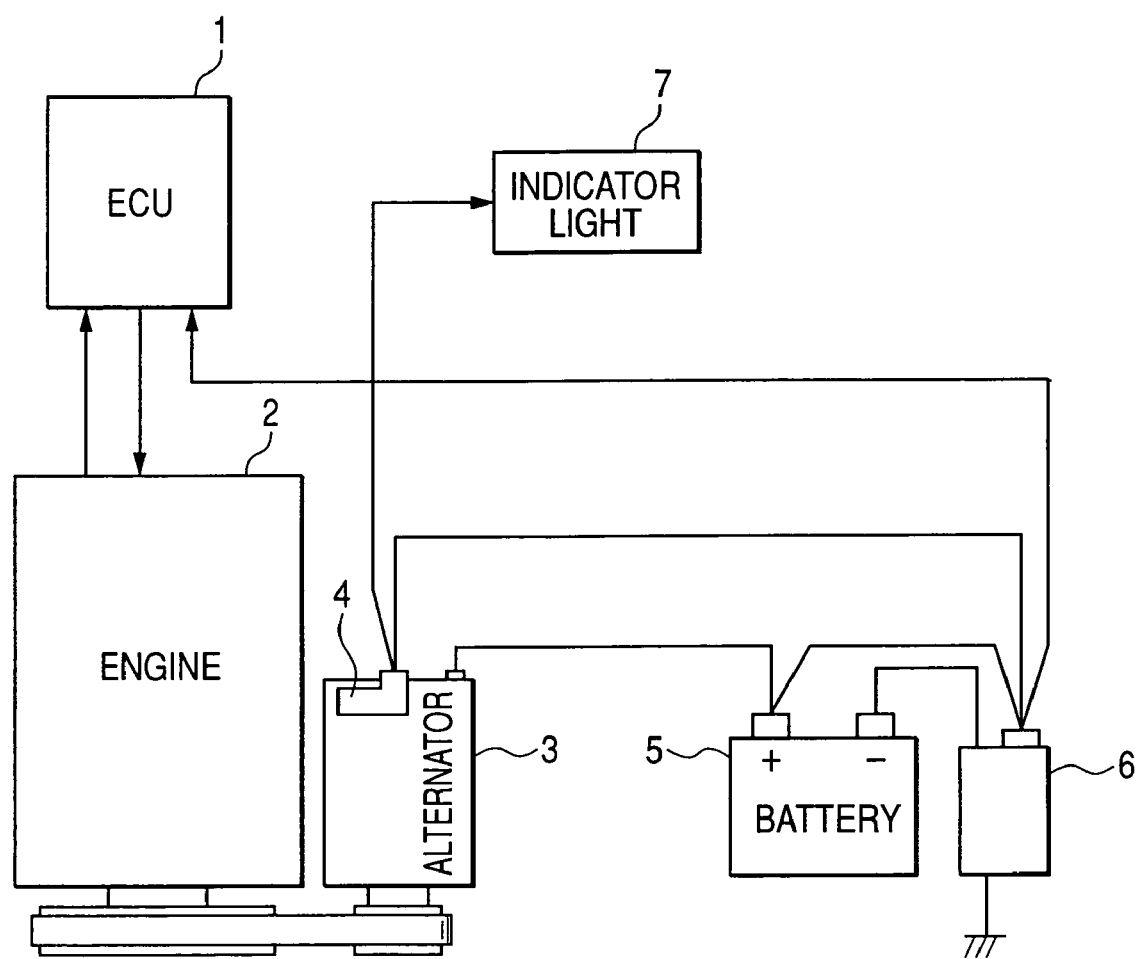
FIG. 1 is a diagram showing an overall structure of a battery charging system including a vehicle-use battery monitor apparatus according to an embodiment of the invention.

FIG. 1 is a diagram showing an overall structure of a battery charging system including a vehicle-use battery monitor apparatus according to an embodiment of the invention. This charging system includes an ECU (Electronic Control Unit) 1, a vehicle engine 2, a vehicle alternator 3, a battery 5, a battery monitor apparatus 6, and an indicator light 7.

The ECU 1 is an electronic control unit serving as an external control apparatus for controlling an output power of the engine 2. The alternator 3 is belt-driven by the engine 2 to generate electric power used for charging the battery 5 and driving various electrical loads (not shown). The alternator 3 includes a vehicle-use power generation control device 4 that controls an output voltage of the alternator 3 by adjusting an excitation current. The battery monitor apparatus 6, which is located near the battery 5, performs an operation of measuring a charging/discharging current of the battery 5, and other various operations (to be described later).

The battery monitor apparatus 6 may be mounted on a terminal or a case of the battery 5. The indicator light 7, which is connected to the power generation control device 4, operates to make a warning of power generation abnormality, and to indicate various messages (to be described later).

Figure 2:
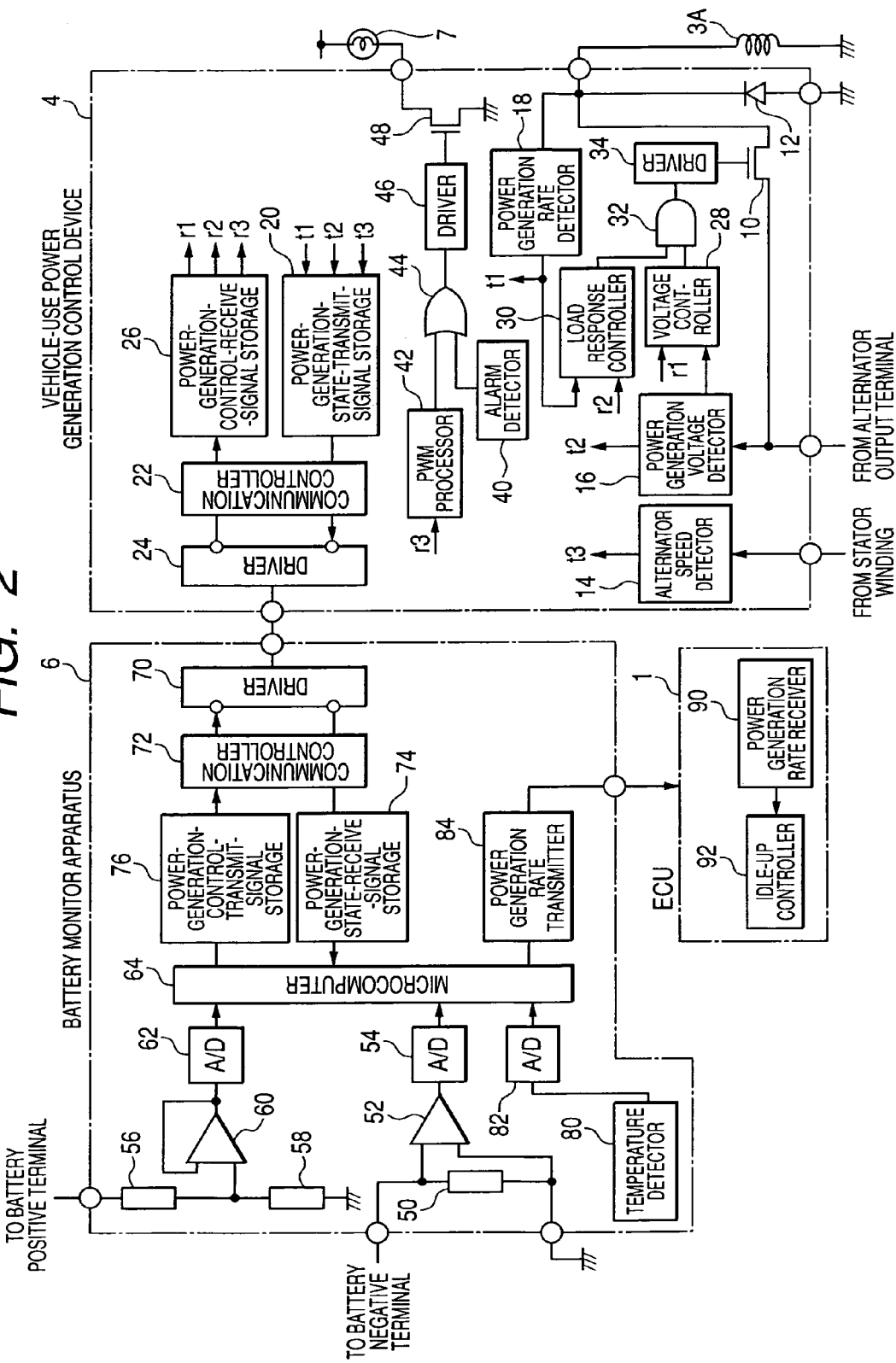
FIG. 2 is a diagram showing detailed structures of the battery monitor apparatus, and a power generation control device included in the battery charging system.

FIG. 2 is a diagram showing detailed structures of the battery monitor apparatus 6, and the power generation control device 4. As shown in FIG. 2, the power generation control device 4 is constituted including a power transistor 10, a flywheel diode 12, an alternator speed detector 14, a power generation voltage detector 16, a power generation rate detector 18, a power-generation-state transmit signal storage 20, a communication controller 22, a driver 24, a power-generation-control receive signal storage 26, a voltage controller 28, a load response controller 30, an AND circuit 32, drivers 34, 46, a warning detector 40, a PWM (Pulse Width Modulation) processor 42, an OR circuit 44, and a transistor 48.

The power transistor 10 is series-connected to an exciting coil 3A of the alternator 3. When the power transistor 10 is turned on, an excitation current is supplied to the exciting coil 3A. The flywheel diode 12 is parallel-connected to the exciting coil 3A to suppress a surge voltage occurred across the exciting coil 3A when the power transistor 10 is turned off.

The alternator speed detector 14 detects a rotation speed of the alternator 3. The rotation speed of the alternator 3 may be detected by monitoring a frequency of a voltage appearing across one of phase windings constituting a stator winding of the alternator 3. The power generation voltage detector 16 detects, as the power generation voltage, a voltage at an output terminal of the alternator 3. The power generation rate detector 18 detects the power generation rate of the alternator 3 indicative of an operating state (power generation state) of the alternator 3. The power generation rate may be detected by monitoring a voltage of an F-terminal which is a connection node between the power transistor 10 and the exciting coil 3A in order to detect an on-duty ratio of the power transistor 10.

The power-generation-state transmit signal storage 20 stores the power generation rate t1, power generation voltage t2, and rotation speed t3 respectively detected by the power generation rate detector 18, power generation voltage detector 16, and alternator speed detector 14. The communication controller 22 converts the power-generation-state transmit signal into a digital signal of a predetermined communication format, and modulates this digital signal. This digital modulated signal is transmitted from the driver 24 to the battery monitor apparatus 6 through a communication line.

The driver 24 has also a function of receiving a digital modulated signal sent from the battery monitor apparatus 6 through the communication line. The communication controller 22 has a function of performing a demodulation process on the digital modulated signal received by the driver 24. The power-generation-state transmit signal obtained by the demodulation process is stored in the power-generation-control receive signal storage 26 as a power-generation-control receive signal. This power-generation-control receive signal includes a power generation voltage command value (r1), a load response control command value (r2), and an indicator light signal (r3). The voltage controller 28 outputs a signal to control the power generation voltage to be a target regulation voltage in accordance with the power generation voltage command value. The load response controller 30 outputs a signal to perform a load response control to increase the power generation rate at a rate in accordance with the load response control command value. The AND circuit 32 receives the signals outputted from the voltage controller 28, and the load response controller 30, and outputs a logical product of these signals to the driver 34 as a drive signal. The driver 34 drives the power transistor 10 in accordance with the drive signal outputted from the AND circuit 32.

The warning detector 40 detects power generation abnormality, charging cable disconnection, etc., and outputs a warning signal (high level signal, for example) depending on the detection. The PWM processor 42 generates a notification signal by PWM-modulating the indicator light signal inputted thereto. The OR circuit 44 outputs a logical sum of the warning signal outputted from the warning detector 40, and the notification signal outputted from the PWM processor 42. The driver 46 drives the transistor 48 to light the indicator light 7 in accordance with the output signal of the OR circuit 44.

As shown in FIG. 2, the battery monitor apparatus 6 is constituted including a shunt resistor 50, amplifiers 52, 60, A/D converters 54, 62, 82, resistors 56, 58, a microcomputer 64, a driver 70, a communication controller 72, a power-generation-state receive signal storage 74, a power-generation-control transmit signal storage 76, a temperature detector 80, and a power generation rate transmitter 84.

The shunt resistor 50, which is a resistor for detecting the charging/discharging current of the battery 5, is connected to a negative terminal of the battery 5 at one end thereof, and grounded at the other end. The amplifier 52, which may be a differential amplifier, amplifies a voltage across the shunt resistor 50. The amplified voltage is converted into digital data by the A/D converter 54, and then inputted into the microcomputer 64.

The resistors 56, 58 constitute a voltage dividing circuit for dividing the battery voltage (the terminal voltage of the battery 5). This voltage dividing circuit is connected to a positive terminal of the battery 5 at one end thereof, and grounded at the other end. The amplifier 60, which may be an operational amplifier, serves as a buffer connected to the output side of the voltage dividing circuit constituted by the resistors 56, 58. The output voltage of the amplifier 60 (equal to a voltage at a node between the resistors 56, 58) is converted into digital data by the A/D converter 62, and then inputted into the microcomputer 64.

The temperature detector 80 outputs a voltage indicative of the temperature of the battery 5. The output voltage of the temperature detector 80 is converted into digital data, and then inputted into the microcomputer 64.

The driver 70, and the communication controller 72, which are provided for signal transmission and reception with the power generation control device 4 through the communication line, perform operations which are basically the same as the operations performed by the driver 24 and the communication controller 22 provided in the power generation control device 4. When the digital modulation signal sent from the power generation control device 4 through the communication line is received by the driver 70, the communication controller 72 performs the demodulation process on this digital modulation signal, and the power-generation-state receive signal obtained by this demodulation process is stored in the power-generation-state receive signal storage 74. When the power-generation-control transmit signal outputted from the microcomputer 64 is stored in the power-generation-control transmit signal storage 76, the communication controller 72 converts this power-generation-control transmit signal into a digital signal of a predetermined communication format, and modulates this digital signal. This digital modulated signal is transmitted from the driver 70 to the power generation control device 4 through the communication line.

The power generation rate transmitter 84 transmits the power generation rate outputted from the microcomputer 64 to the ECU 1 through the communication line. Here, the microcomputer 64 outputs the power generation rate as it is, or after changing a value of the power generation rate to the power generation rate transmitter 84, this power generation rate being included in the power-generation-state receive signal transmitted from the power generation control device 4 and stored in the power-generation-state receive signal storage 74. Explanation will be given later as to how the power generation rate is determined. When the power generation rate is changed, the microcomputer 64 generates the indicator light signal to notify a vehicle driver or a user of that fact by use of the indicator light 7.

As shown in FIG. 2, the ECU 1 includes a power generation rate receiver 90, and an idle-up controller 92. The power generation rate receiver 90 receives the power generation rate transmitted from the power generation rate transmitter 84 of the battery monitor apparatus 6. The idle-up controller 92 performs an idle-up control to increase an idle speed of the engine 2 in accordance with the power generation rate received by the power generation rate receiver 90. The idle-up controller 92 may be configured to perform the idle-up control when the power generation rate is 100%.

Figure 3:
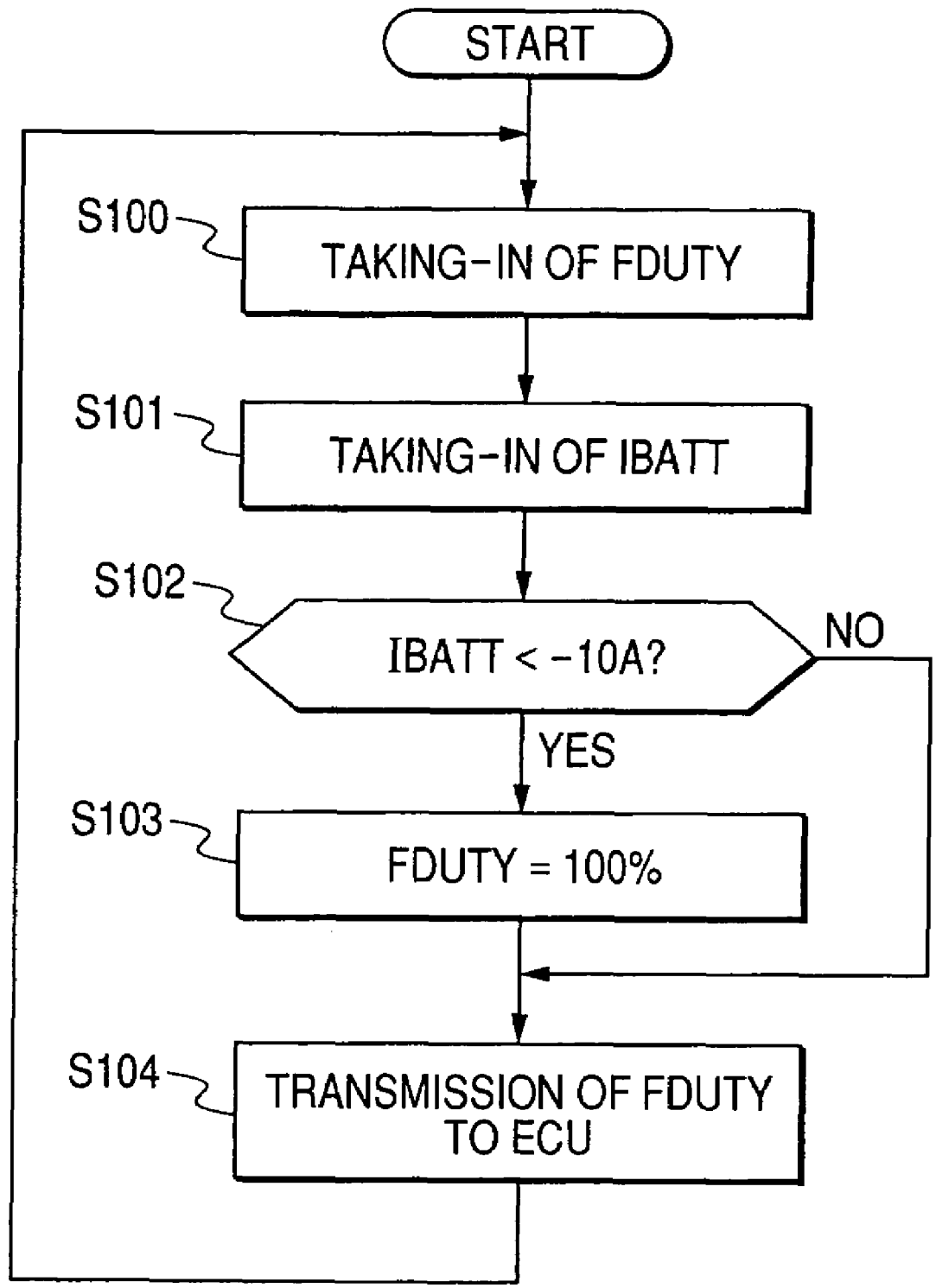
FIG. 3 is a flowchart showing an operation of the battery monitor apparatus, which is related to a power generation rate transmission.

Next, explanation is made as to the operation of the battery monitor apparatus 6 having the above described structure. FIG. 3 is a flowchart showing the operation of the battery monitor apparatus 6, which is related to transmission of the power generation rate. The battery monitor apparatus 6 performs this operation at regular time intervals, for example, at time intervals shorter than $1/10$ of a time constant of a rotor of the alternator 3.

When the driver 70 receives the power-generation-state transmit signal transmitted from the power generation control device 4, the communication controller 72 performs the demodulation process on this signal, and the resultant data indicative of the power generation state of the alternator 3 is stored in the power-generation-state receive signal storage 74. The power generation state includes the power generation rate FDUTY, a rotation speed N_ALT, power generation voltage Vb, etc. of the alternator 3. After the data indicative of the power generation state of the alternator 3 is stored in the power-generation-state receive signal storage 74, the microcomputer 64 takes in the power generation rate FDUTY therefrom (step S100). Subsequently, the microcomputer 64 takes in the battery current IBATT measured by use of the shunt resistor 50 through the A/D converter 54 (step S101).

Next, the microcomputer 64 makes a determination as to whether or not the battery 5 is in a discharge state, and discharge current is larger than a predetermined threshold current (step S102). For example, the battery 5 may be determined to be in a discharge state if the sign of the battery current IBATT is negative, and in a charge state if the sign of the battery current IBATT is positive. The threshold current is set to a value smaller than an operating current of an air conditioning apparatus mounted on the vehicle. In this embodiment, the operating current of the air conditioning apparatus is 15 A, and the threshold current is set to 10 A. Accordingly, at step S102, the microcomputer 64 makes a determination as to whether or not the absolute value of the discharge current is larger than 10 A.

If the determination result at step S102 is affirmative, the microcomputer 64 increases the value of the power generation rate FDUTY (for example, to 100% corresponding to full excitation, or somewhat smaller value) transmitted from the power generation control device 4 (step S103). This increased power generation rate FDUTY is transmitted from the power generation rate transmitter 84 to the ECU 1 (step S104).

On the other hand, if the determination result at step S102 is negative, the power generation rate FDUTY is transmitted from the power generation rate transmitter 84 to the ECU 1 as it is without undergoing any change (step S104).

In a situation where the load response control (gradual excitation control) is performed when electrical load is applied to the alternator 3, if the ECU 1 attempts to increase the idle engine speed, the timing at which the ECU 1 issues a command to increase the rotation speed of the engine is delayed in a conventional configuration, because the power generation rate increases only gradually in the conventional configuration. In contrast, in this embodiment, the idle engine speed can be increased rapidly, because, when the battery 5 is in a discharge state, the power generation rate FDUTY to be given to the ECU 1 is increased without waiting for the increase of the actual power generation rate of the alternator 3 to a predetermined value (to 100%, for example). This makes it possible to rapidly restore the battery voltage that has bee lowered by the electrical load application. Since the ECU 1 needs only the power generation rate that has undergone the necessary change for its operation, it is possible that the ECU 1 uses a conventionally used processing algorithm to monitor the power generation rate. This minimizes the number of necessary changes in the ECU 1. The determination as to presence of electrical load application is made on the basis of the discharge state of the battery 5. This makes it possible to prevent the secular variation of the internal resistance of the battery 5 from effecting this determination, unlike the case where the determination is made on the basis of the terminal voltage of the battery 5.

The threshold value to make the determination as to whether the battery 5 is in the discharge state is set to a value smaller than the operating current of the air conditioning apparatus. This makes it possible to inform the ECU 1 early and reliably of the increase of the power generation amount, and the increase of the mechanical load of the engine 2 due to activation of the air conditioning apparatus, so that the effect of stabilizing the engine speed can be further improved.

Figure 4:
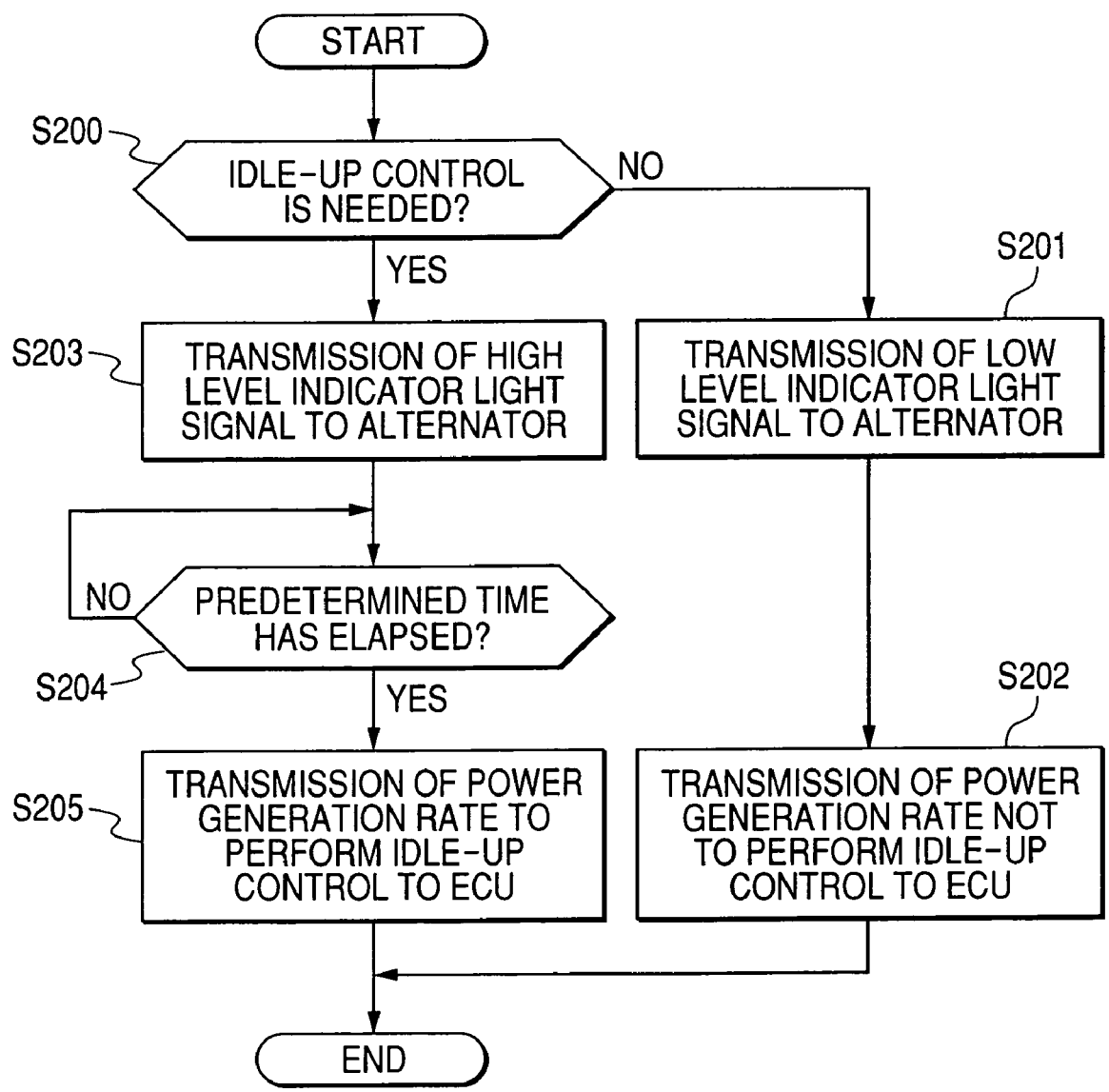
FIG. 4 is a flowchart showing an operation of the battery monitor apparatus, which is related to generation and transmission of an indicator light signal.

FIG. 4 is a flowchart showing the operation of the battery monitor apparatus 6, which is related to generation and transmission of the indicator light signal. The battery monitor apparatus 6 performs this operation at the same time intervals with the operation shown in FIG. 3.

The microcomputer 64 makes a determination as to whether or not the idle-up control needs to be performed (step S200). Here, the idle-up control is determined to need to be performed in a case where the power generation rate FDUTY is set to 100% at step S103 shown in FIG. 3. In other cases, step S200 makes a negative determination. If the determination result at step S200 is negative, the microcomputer 64 transmits the low level indicator light signal to the power generation control device 4 included in the alternator 3 (step S201). After that, the microcomputer 64 transmits the power generation rate FDUTY set for the case where the idle-up control is not performed to the ECU 1 (step S202). Although, the transmitting operations of the power generation rate FDUYU at step S202, and at step S104 after making the negative determination at step S102 shown in FIG. 3 overlap to each other, step S202 is shown in FIG. 4 so that the relationship between the transmission timing of the indicator light signal and the transmission timing of the power generation rate can be easily understood.

If the determination result at step S200 is affirmative, the microcomputer 64 transmits the high level indicator light signal to the power generation control device 4 (step S203). Next, the microcomputer 64 determines whether or not a predetermined time has elapsed since the transmission of the indicator light signal (step S204). Step S204 is repeated while the determination result is negative. If the determination result at step S204 becomes affirmative, the microcomputer 64 transmits the power generation rate FDUTY set for the case of where the idle-up control is performed to the ECU 1 (step S205). Although, the transmitting operations of the power generation rate FDUTY at step S205, and at step S104 after making the affirmative determination at step S102 shown in FIG. 3 overlap to each other, step S205 is shown in FIG. 4 so that the relationship between the transmission timing of the indicator light signal and the transmission timing of the power generation rate can be easily understood.

In response to the high-level indicator light signal, the PWM processor 42 of the power generation control device 4 outputs a notification signal which is PWM-modulated to show high and low levels alternately. The driver 46 on/off-drives the transistor.48 in accordance with the notification signal, to thereby perform a notification operation in which the indicator light 7 blinks.

In this case, since the user (driver) of the vehicle is notified of that the idle engine speed is going to increase when the power generation rate FDUTY is changed to a large value (100%), it is possible to prevent the user (driver) of the vehicle feeling strange when the engine speed increases.

The battery monitor apparatus 6 transmits the indicator light signal to the power generation control device 4, and after a predetermined time has elapsed since then, the power generation rate FDUTY set for the case where the idle-up control is performed is transmitted to the ECU 1. This makes it possible for the user to know in advance that the idle engine speed is going to increase, and to take an appropriate measure, for example, stepping on the brakes hard.

The indicator light 7 is controlled by the power generation control device 4 included in the alternator 3. This makes it possible to use the indicator light 7, which is provided for making warnings, also for the purpose of making the notification of performing the idle-up control (changing the power generation rate FDUTY). Accordingly, the component count can be reduced.

In the above described example, the notification of performing the idle-up control is made by causing the indicator light 7 to blink. However, this notification by use of the indication light 7 may be made in different indicating manners. For example, the brightness of the indicator light 7 when used to make the notification of performing the idle-up control may be set lower than when used to make warning, or may be controlled to gradually increase or decrease. Also, the luminescent color of the indicator light 7, which is usually red in making warning, may be changed to different color (green, or yellow, for example) in making the notification of performing the idle-up control in these indicating manners, or in causing the indication light 7 to glow continuously.

Figure 5:
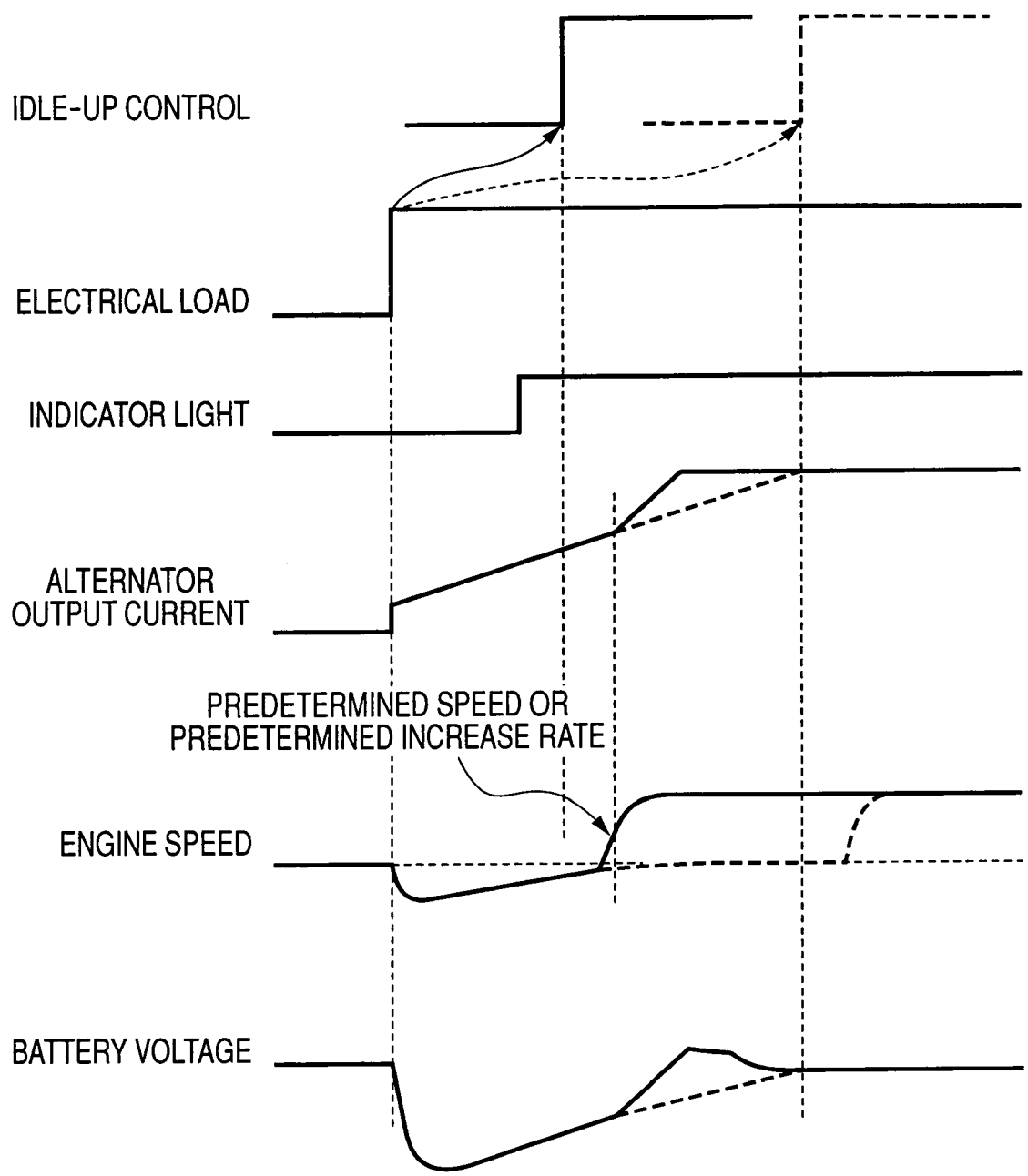
FIG. 5 is a diagram showing operation timings of the charging system shown in FIG. 1.

FIG. 5 is a diagram showing the operation of the charging system shown in FIG. 1. In FIG. 5, an ideal idle engine speed is shown by "IDLE-UP", and an actual engine speed is shown by "ENGINE SPEED". Each of the broken lines in FIG. 5 shows a characteristic in a case where the load response control is performed by use of a conventional configuration. The indication state of the indication light 7 is shown by "INDICATION LIGHT". The low level corresponds to an off state, and the high level corresponds to a blinking state. As shown in FIG. 5, with the battery monitor apparatus 6, it is possible to advance the timing at which the idle engine speed is increased compared to the case where the conventional configuration is used. In addition, the drop of the battery voltage when the load response control is performed can be suppressed by rapidly increasing the output voltage of the alternator 3. Furthermore, the blinking of the indicator light 7 makes it possible for the user to know in advance that the engine speed is going to increase.

Figure 6:
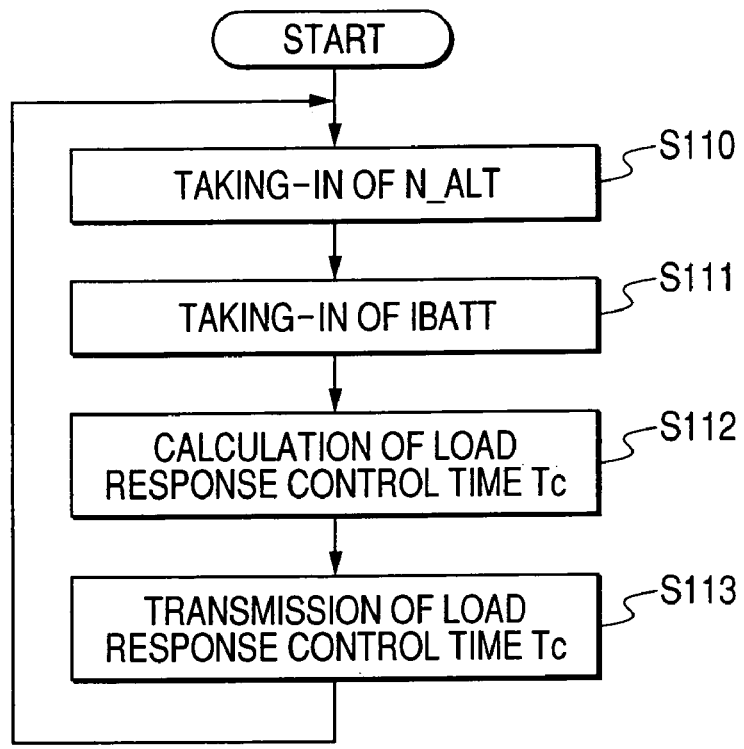
FIG. 6 is a flowchart showing an operation of the battery monitor apparatus 6, which is related to a load response control.

FIG. 6 is a flowchart showing the operation of the battery monitor apparatus 6, which is related to the load response control. This operation is performed in conjunction with the operation shown in FIG. 3. Accordingly, overlapping operation steps may be omitted.

When the driver 70 receives the power-generation-state transmit signal sent from the power generation control device 4, the communication controller 72 performs the demodulation process on this signal, and the resultant data indicative of the power generation state of the alternator 3 is stored in the power-generation-state receive signal storage 74. The power generation state includes the power generation rate FDUTY, rotation speed N_ALT, power generation voltage Vb, etc. of the alternator 3. After the data indicative of the power generation state of the alternator 3 is stored in the power-generation-state receive signal storage 74, the microcomputer 64 takes in the rotation speed N_ALT therefrom (step S110). Subsequently, the microcomputer 64 takes in the battery current IBATT measured by use of the shunt resistor 50 through the A/D converter 54 (step S111).

Next, the microcomputer 64 calculates a load response control time Tc as a load response control value by use of a predetermined function Tc=f(N_ALT, IBATT) including the rotation speed N_ALT and battery current IBATT as parameters (step S112).

Figure 7:
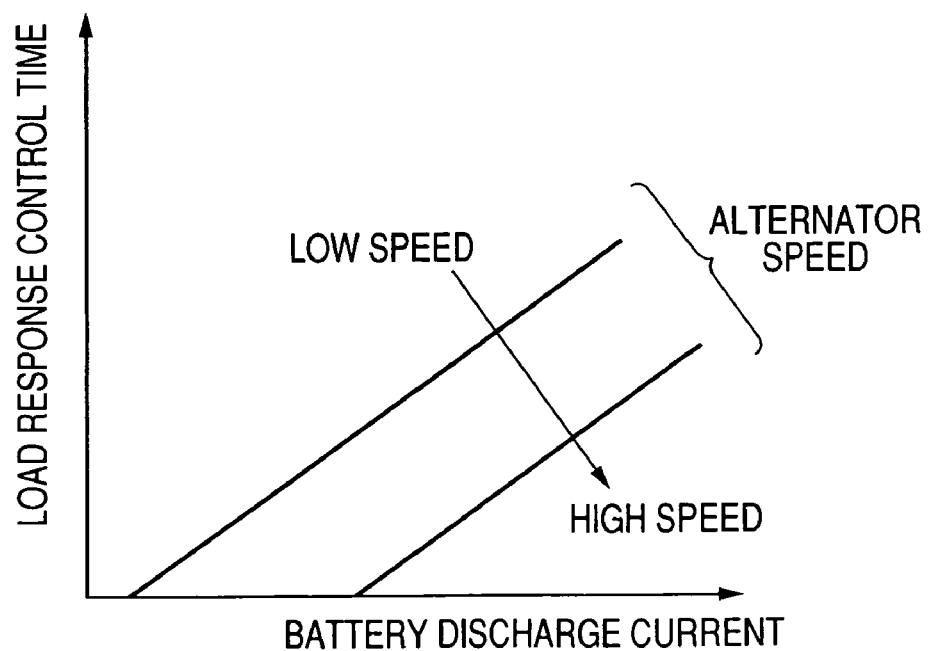
FIG. 7 is a diagram showing a relationship among an alternator rotation speed, a battery current, and a load response control time.

FIG. 7 is a diagram showing a relationship among the rotation speed N_ALT, battery current IBATT, and load response control time Tc. As seen from FIG. 7, the load response control time Tc is set longer as the battery current (battery discharge current) IBATT increases. Also, the load response control time Tc is set longer as the rotation speed N_ALT becomes low. The load response control time Tc may be obtained by referring to a table containing the relationship shown in FIG. 7, instead of using the function Tc=f(N_ALT, IBATT).

Next, the microcomputer 64 stores the power-generation-control transmit signal including the calculated load response control time Tc in the power-generation-control transmit signal storage 76, so that the load response control time Tc is transmitted to the power generation control unit 4 as the load response control command value (step S113).

In a case where the discharge current of the battery 5 is large, it can be assumed that a large electrical load has been applied. Accordingly, in this case, the load response control time Tc may be set long, so that the power generation amount of the alternator 3 increases only gradually to lessen the load of the engine 2, to thereby further improve the effect of stabilizing the engine speed.

Figure 8:
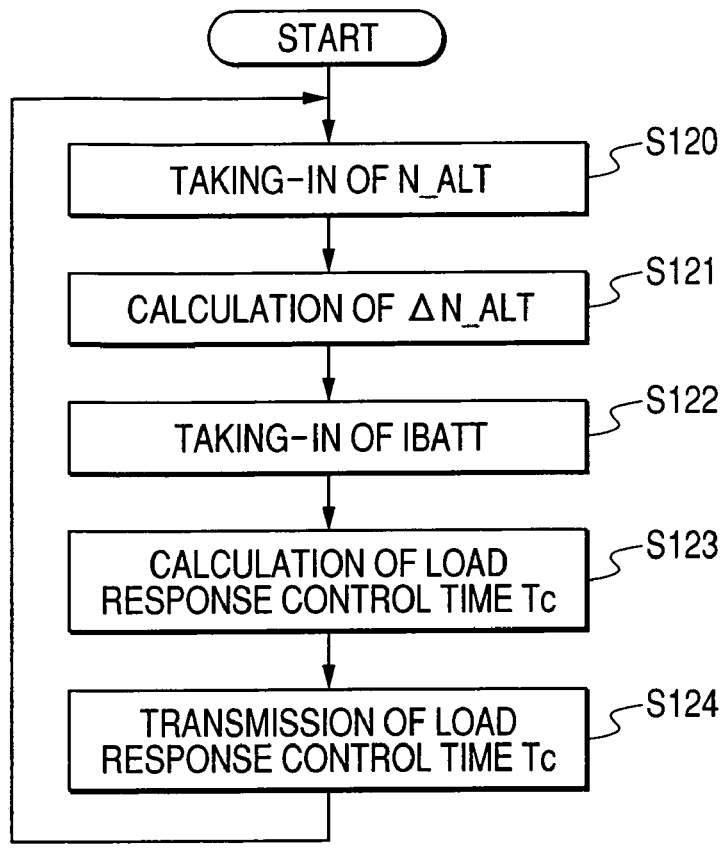
FIG. 8 is a flowchart showing another operation of the battery monitor apparatus, which is related to the load response control.

FIG. 8 is a flowchart showing another operation of the battery monitor apparatus 6, which is related to the load response control. This operation is performed in conjunction with the operation shown in FIG. 3. Accordingly, overlapping operation steps may be omitted.

When the driver 70 receives the power-generation-state transmit signal sent from the power generation control device 4, the communication controller 72 performs the demodulation process on this signal, and the resultant data indicative of the power generation state of the alternator 3 is stored in the power-generation-state receive signal storage 74. The power generation state includes the power generation rate FDUTY, rotation speed N_ALT, power generation voltage Vb, etc. of the alternator 3. After the data indicative of the power generation state of the alternator 3 is stored in the power-generation-state receive signal storage 74, the microcomputer 64 takes in the rotation speed N_ALT therefrom (step S120), and calculates a rotation speed variation ΔN_ALT (step S121). The rotation speed variation ΔN_ALT may be calculated by subtracting from the rotation speed N_ALT taken in this time the rotation speed N_ALT taken in previous time. Alternatively, the rotation speed variation ΔN_ALT may be calculated by subtracting from the rotation speed N_ALT taken in this time an average value of a predetermined number of the rotation speed variations Δ N_ALT taken in until previous time. Subsequently, the microcomputer 64 takes in the battery current IBATT measured by use of the shunt resistor 50 through the A/D converter 54 (step S122).

Next, the microcomputer 64 calculates a load response control time Tc as a load response control value by use of a predetermined function Tc=f(ΔN_ALT, IBATT) including the rotation speed variation ΔN_ALT and battery current IBATT as parameters (step S123).

Figure 9:
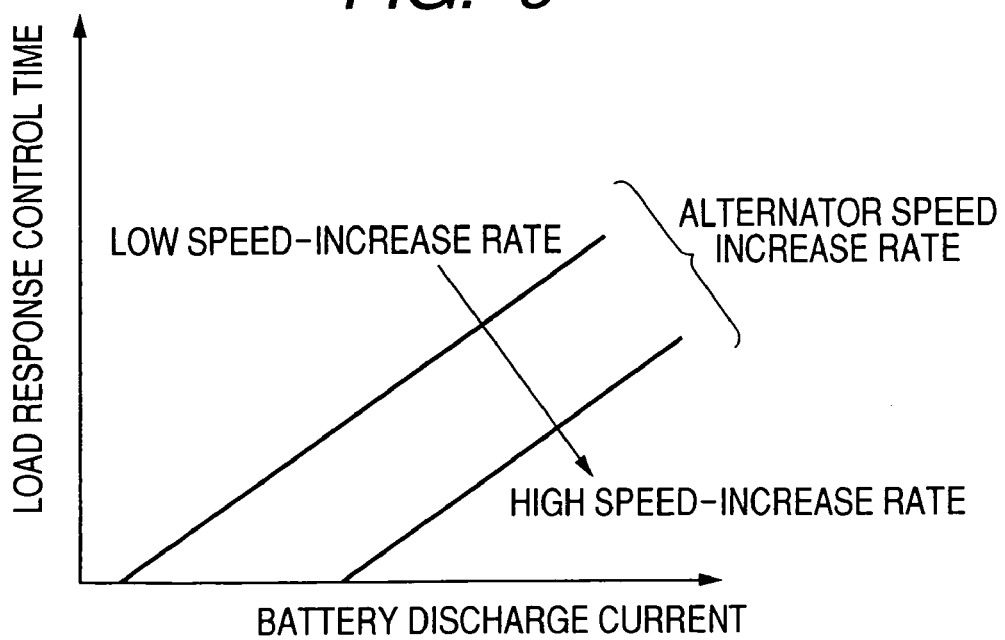
FIG. 9 is a diagram showing a relationship among a rotation speed variation, the battery current, and the load response control time.

FIG. 9 is a diagram showing a relationship among the rotation speed variation ΔN_ALT, the battery current IBATT, and the load response control time Tc. As seen from FIG. 9, the load response control time Tc is set longer as the battery current (battery discharge current) IBATT increases. Also, the load response control time Tc is set longer as the rotation speed variation Δ N_ALT becomes small. The load response control time Tc may be obtained by referring to a table containing the relationship shown in FIG. 9, instead of using the function Tc=f(ΔN_ALT, IBATT).

Next, the microcomputer 64 stores the power-generation-control transmit signal including the calculated load response control time Tc in the power-generation-control transmit signal storage 76, so that the load response control time Tc is transmitted to the power generation control unit 4 as the load response control command value (step S124).

When the engine speed is increased at the time of electrical load application, the increase of the engine speed becomes gentle, that is, the increase rate of the engine speed becomes small, if the load torque (power generation torque) of the alternator 3 is large. In such case, by setting the load response control time Tc longer in order that the power generation amount increases only gradually, it becomes possible to lessen the load of the engine 2, to thereby further improve the effect of stabilizing the engine speed.

Figure 10:
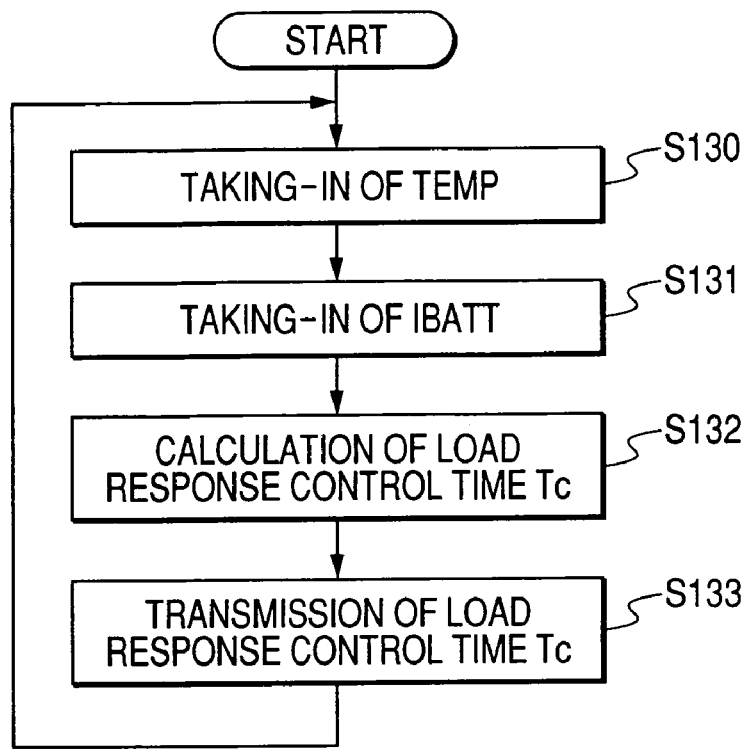
FIG. 10 is a flowchart showing another operation of the battery monitor apparatus, which is related to the load response control.

FIG. 10 is a flowchart showing another operation of the battery monitor apparatus 6, which is related to the load response control. This operation is performed in conjunction with the operation shown in FIG. 3. Accordingly, overlapping operation steps may be omitted.

The microcomputer 64 takes in the output voltage of the temperature detector 80 as a battery temperature TEMP, and the battery current IBATT measured by use of the shunt resistor 50 through the A/D converter 54 (step S131).

Next, the microcomputer 64 calculates a load response control time Tc as a load response control value by use of a predetermined function Tc=f(TEMP, IBATT) including the battery temperature TEMP and battery current IBATT as parameters (step S132).

Figure 11:
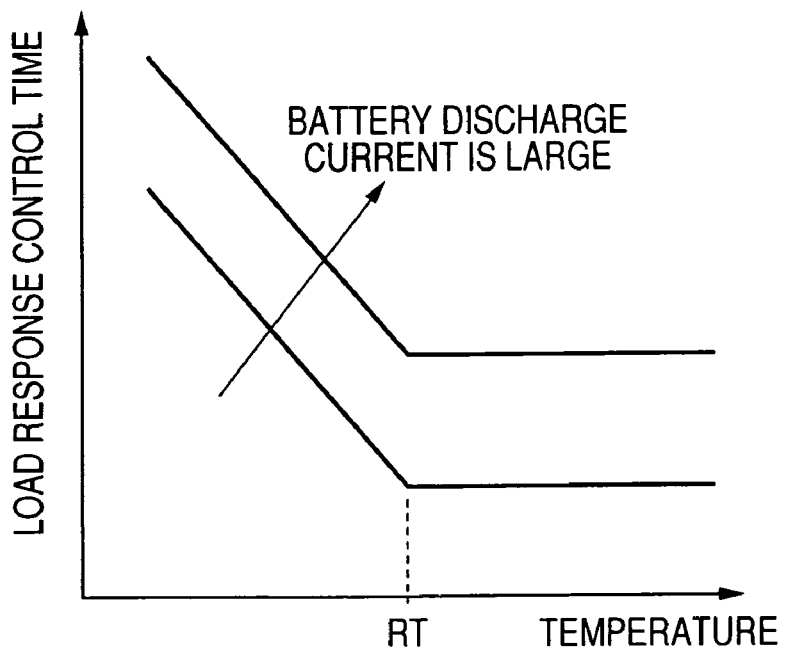
FIG. 11 is a diagram showing a relationship among a battery temperature, the battery current, and the load response control time.

FIG. 11 is a diagram showing a relationship among the battery temperature TEMP, battery current IBATT, and the load response control time Tc. As seen from FIG. 11, the load response control time Tc is set longer as the battery temperature TEMP decreases when the battery temperature TEMP is below a predetermined temperature RT, and is set at a constant value when the battery temperature TEMP is above the predetermined temperature RT. Also, the load response control time Tc is set longer as the battery discharge current increases. The load response control time Tc may be obtained by referring to a table containing the relationship shown in FIG. 9, instead of using the function Tc=f(TEMP, IBATT).

Next, the microcomputer 64 stores the power-generation-control transmit signal including the calculated load response control time Tc in the power-generation-control transmit signal storage 76, so that the load response control time Tc is transmitted to the power generation control unit 4 as a load response control command value (step S133).

In cold weather when the temperature of the battery 5 and the temperature of the alternator 3 are low, since the output current becomes large, the power generation torque becomes large. In such case, by setting the load response control time Tc longer in order that the power generation amount increases only gradually, it becomes possible to lessen the load of the engine 2, to thereby further improve the effect of stabilizing the engine speed.

Figure 12:
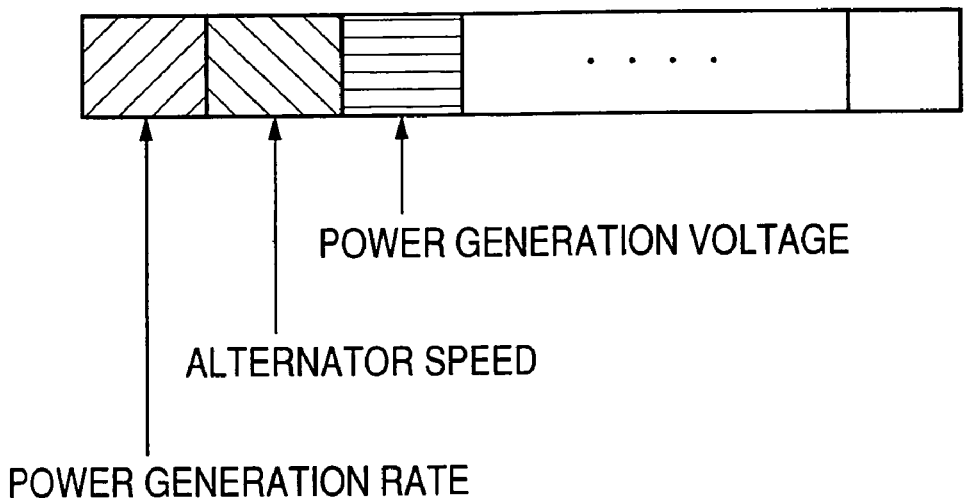
FIG. 12 is a diagram showing a frame format of a power-generation-state transmit signal transmitted from the power generation control device to the battery monitor apparatus.

FIG. 12 is a diagram showing a frame format of the power-generation-state transmit signal transmitted from the power generation control unit 4 to the battery monitor apparatus 6. As shown in FIG. 12, this frame format includes data areas for respectively containing the power generation rate FDUTY, rotation speed N_ALT, and power generation voltage Vb.

Figure 13:
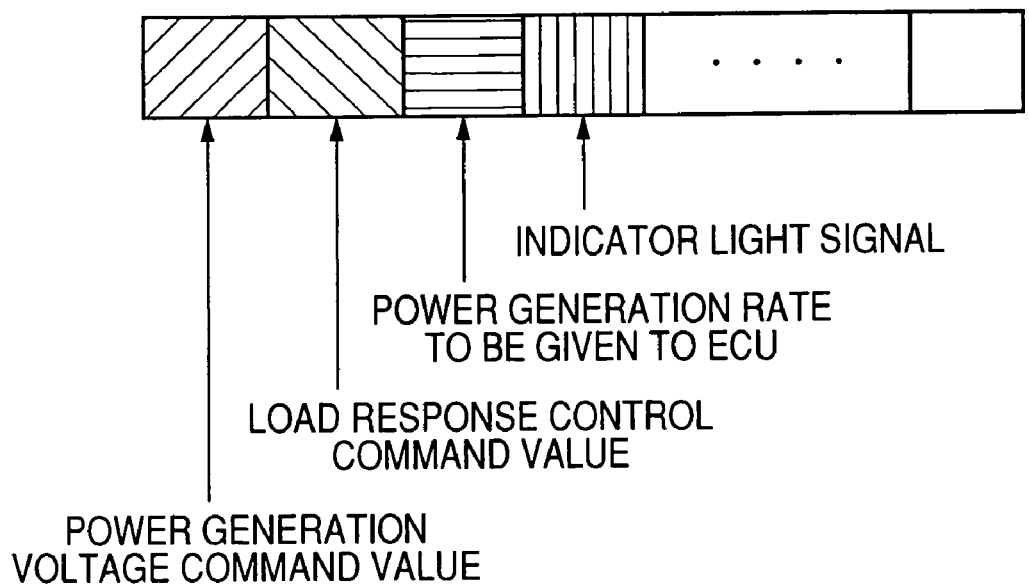
FIG. 13 is a diagram showing a frame format of a power-generation-control transmit signal transmitted from the battery monitor apparatus.

FIG. 13 is a diagram showing a frame format of the power-generation-control transmit signal transmitted from the battery monitor apparatus 6. As shown in FIG. 13, this frame format includes data areas for respectively containing the power generation voltage command value, load response control command value, power generation rate to be given to the ECU1, and indicator light signal. This frame-format is commonly used for the signal transmitted from the battery monitor apparatus 6 to the power generation control device 4, and the signal transmitted from the battery monitor apparatus 6 to the ECU 1. Accordingly, this frame format only contains data needed at a given time. Alternatively, the signal to be transmitted to the power generation control unit 4 and the signal to be transmitted to the ECU 1 may be contained in the same frame format, so that the power generation control unit 4 and the ECU 1 receive the same signal. In this case, the power generation rate outputted from the power generation rate transmitter 84 is stored in the power-generation-control transmit signal storage 76.

It is a matter of course that various modifications can be made to the above described embodiment. For example, although the indicator light 7 is driven by the power generation control unit 4 of the alternator 3 in this embodiment, the indicator light 7 may be driven by the battery monitor apparatus 6 or by ECU 1.

Figure 14:
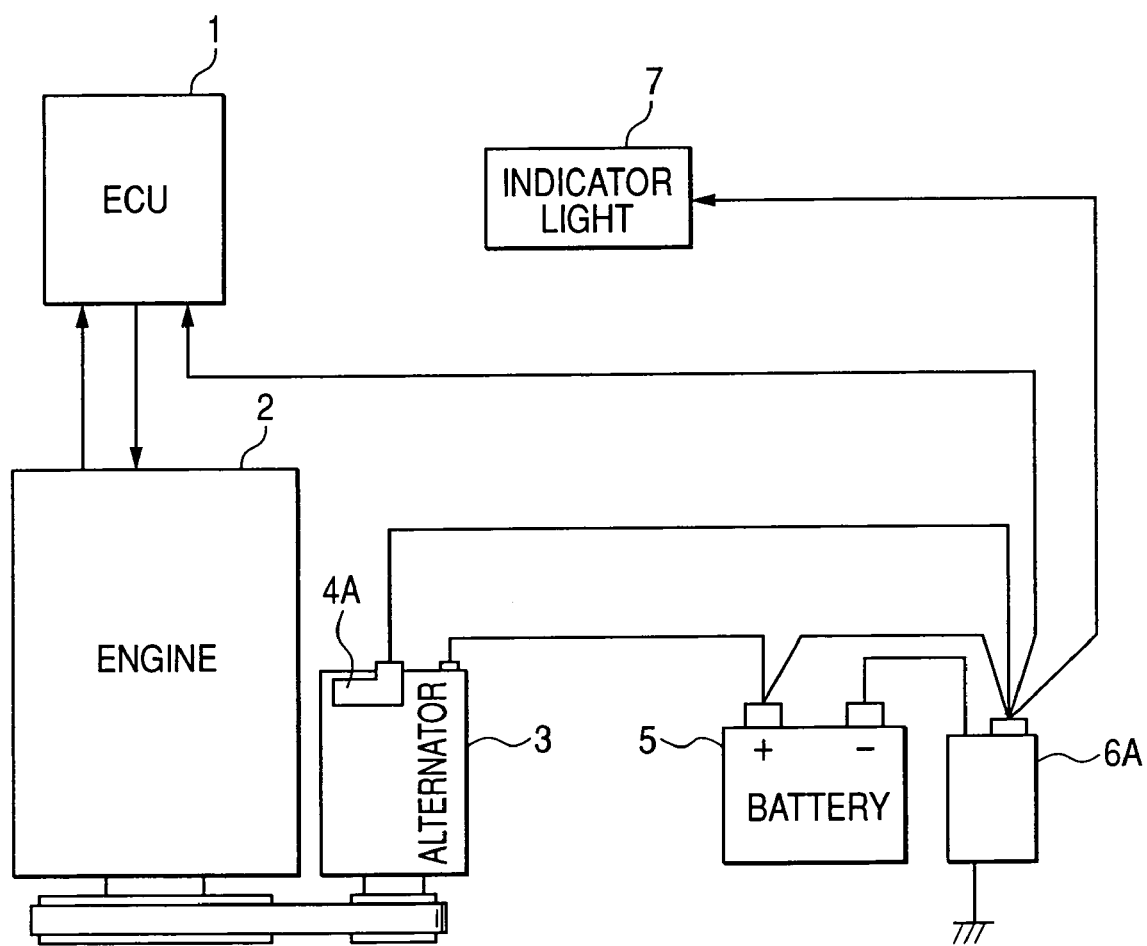
FIG. 14 is a diagram showing an overall structure of a variant of the battery charging system modified such that the battery monitor apparatus drives an indication light to make a necessary notification.

FIG. 14 is a diagram showing an overall structure of a variant of the battery charging system modified such that the battery monitor apparatus 6 drives the indicator light 7 to make a necessary notification. As shown in FIG. 14, in this variant, unlike the above described embodiment, the indicator light 7 is not connected to the power generation control device 4, but to the battery monitor apparatus 6A.

Figure 15:
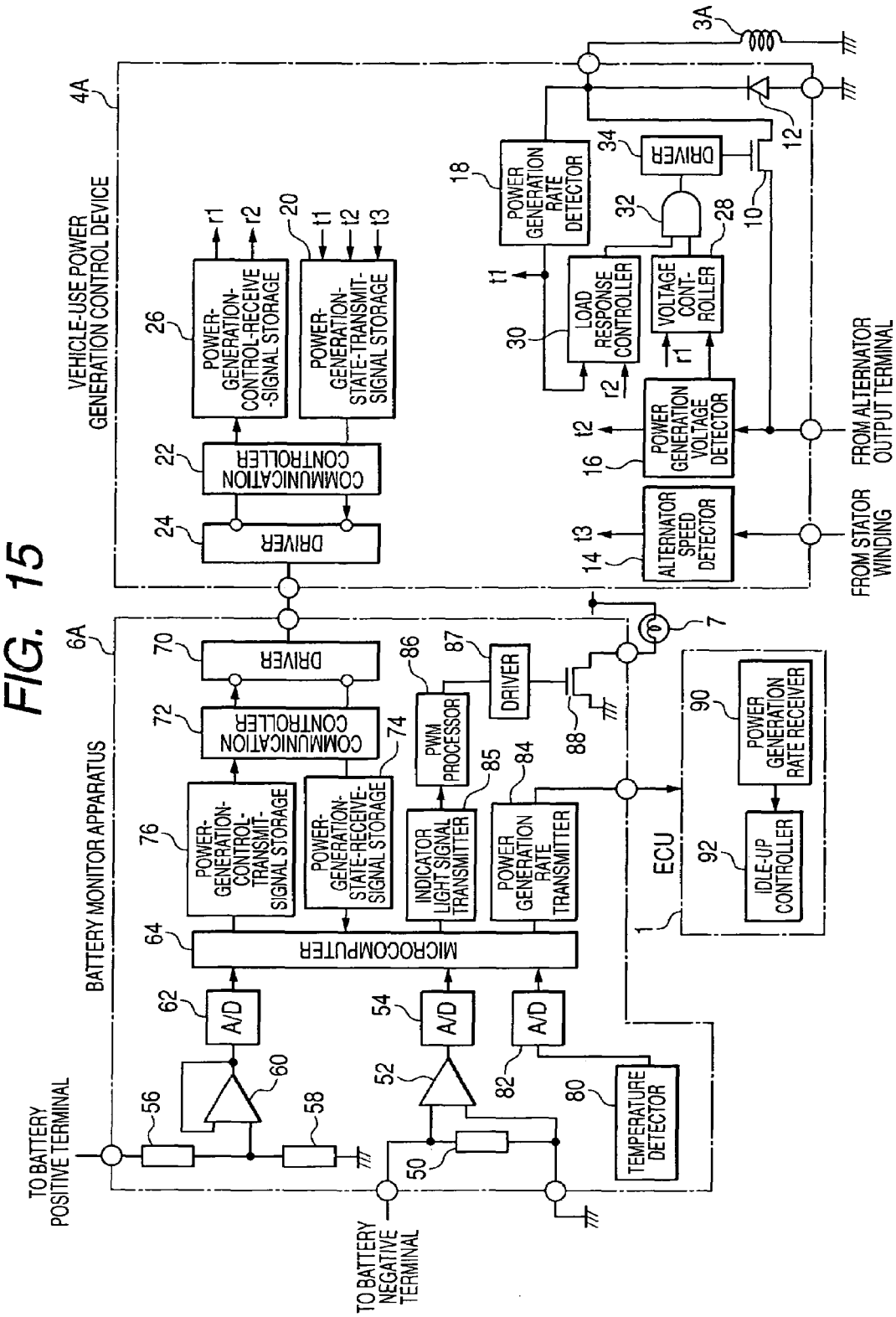
FIG. 15 is a diagram showing detailed structures of the battery monitor apparatus, and power generation control device included in the variant shown in FIG. 14.

FIG. 15 is a diagram showing detailed structures of the battery monitor apparatus 6A, and the power generation control device 4A included in this variant. The power generation control device 4A shown in FIG. 15 differs in structure from the power generation control device 4 shown in FIG. 2 in that it does not include the warning detector 40, PWM processor 42, OR circuit 44, driver 46, and transistor 48. The battery monitor apparatus 6A shown in FIG. 15 differs in structure from the battery monitor apparatus 6 shown in FIG. 2 in that it is added with an indicator light signal transmitter 85, a PWM processor 86, a driver 87, and a transistor 88. The indicator light signal transmitter 85 outputs an indicator light signal in accordance with a command from the microcomputer 64. Upon receiving the indicator light signal of high level, the PWM processor 86 generates a notification signal by PWM-modulating this indicator light signal. The driver 87 drives the transistor 88 in accordance with the notification signal so that the indicator light 7 lights or blinks in green.

Figure 16:
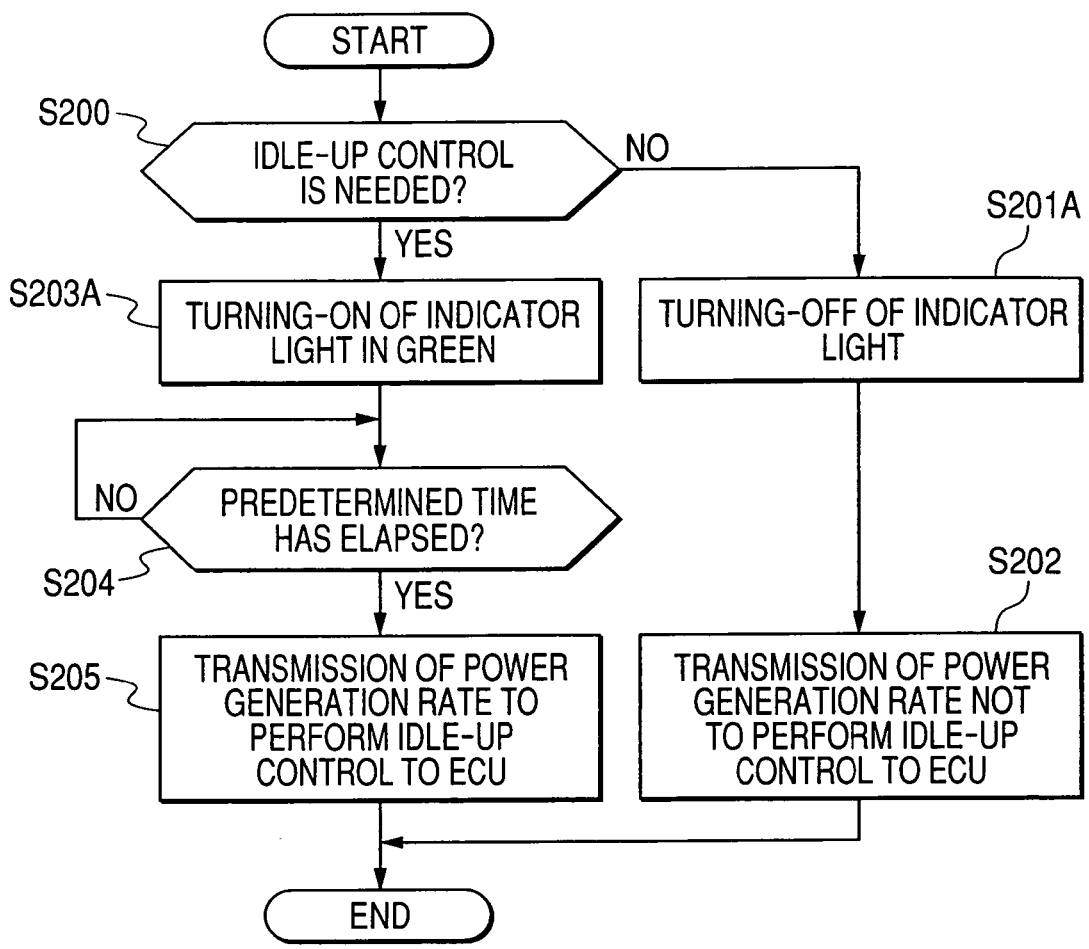
FIG. 16 is a flowchart showing an operation of the battery monitor apparatus shown in FIG. 15.

FIG. 16 is a flowchart showing the operation of the battery monitor apparatus 6A shown in FIG. 15. This operation differs the operation shown in FIG. 4 in that steps S201 and S203 are respectively changed to steps S201A and S203A. In the operation shown in FIG. 4, the high level indicator light signal is transmitted (step S203) when the idle-up control is needed, and the low level indicator light signal is transmitted (step S201) when the idle-up control is not needed. On the other hand, in the operation shown in FIG. 15, since the lighting state of the indicator light 7 is controlled without performing transmission of the indicator light signal, the indicator light 7 is caused to light or blink (step S203A) when the idle-up control is necessary, and the indicator light 7 is caused to turn off (step S201A) when the idle-up control is not needed.

Figure 17:
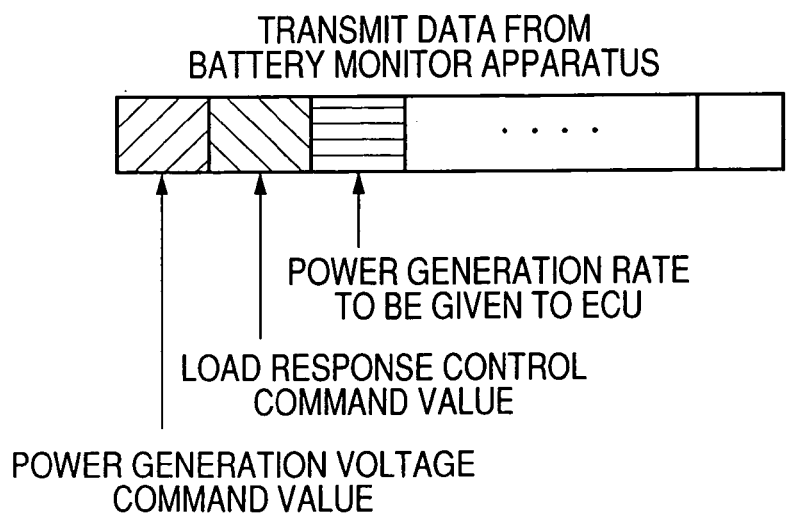
FIG. 17 is a diagram showing a frame format of a power-generation-control transmit signal transmitted from the battery monitor apparatus shown in FIG. 15.

FIG. 17 is a diagram showing a frame format of the power-generation-control transmit signal transmitted from the battery monitor apparatus 6A. As shown in FIG. 17, this frame format includes data areas for respectively containing the power generation voltage command value, load response control command value, and power generation rate to be given to the ECU. Since the indicator light signal does not need to be transmitted, unlike the frame format shown in FIG. 13, the frame format shown in FIG. 17 does not include the data area for containing the indicator light signal.

Figure 18:
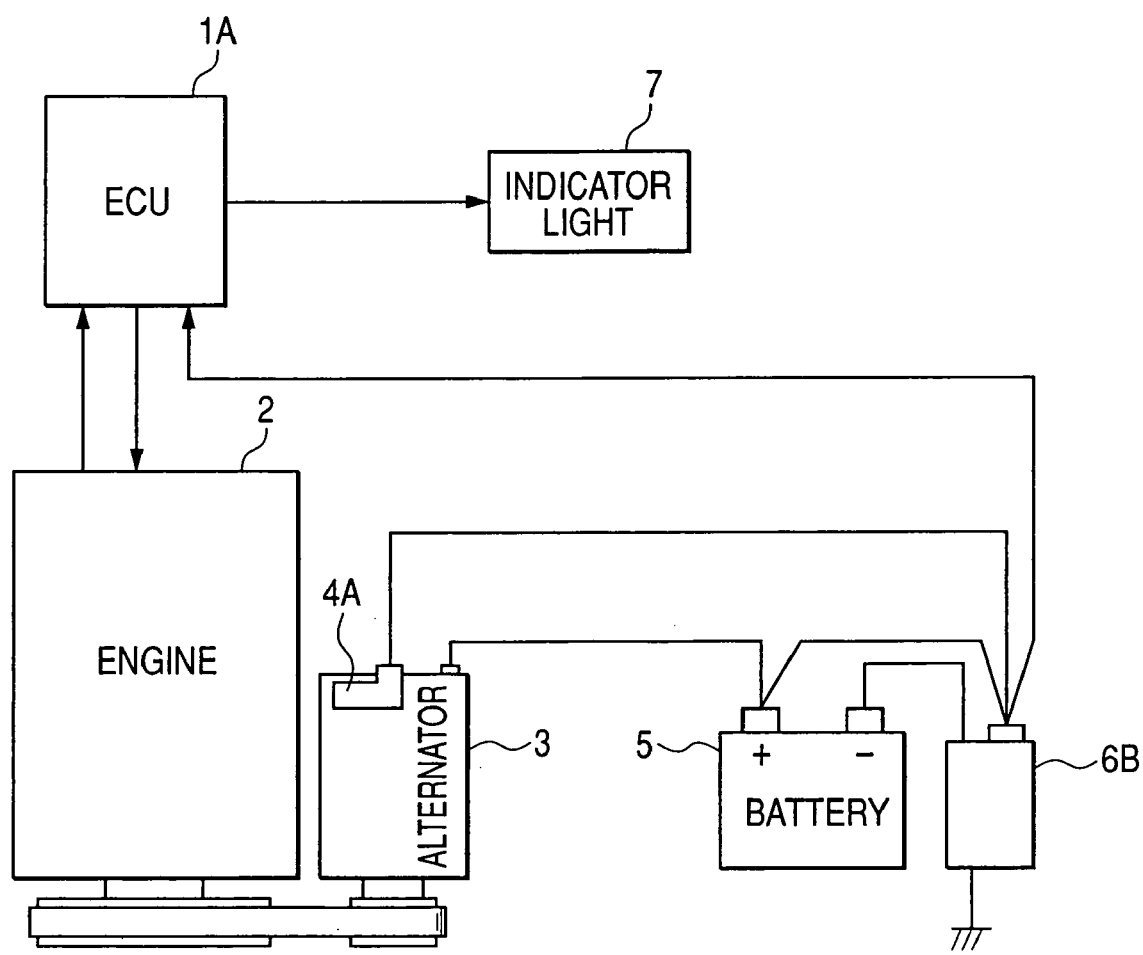
FIG. 18 is a diagram showing an overall structure of another variant of the battery charging system modified such that an ECU drives the indicator light to make a necessary notification.

FIG. 18 is a diagram showing an overall structure of a variant of the battery charging system modified such that the ECU drives the indicator light 7 to make a necessary notification. As shown in FIG. 18, in this variant, unlike the above described embodiment, the indication light 7 is not connected to the power generation control device 4, but to the ECU 1A.

Figure 19:
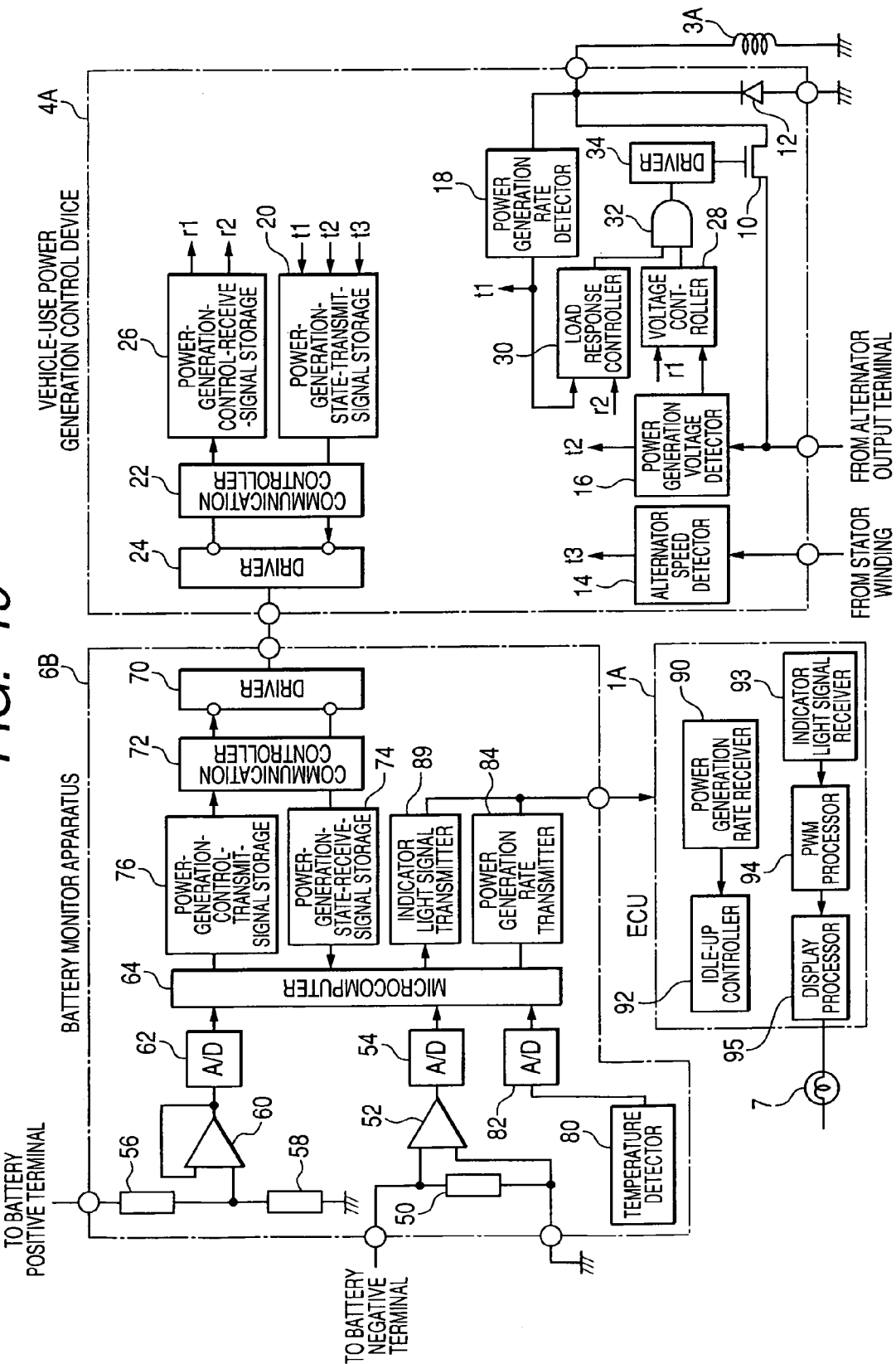
FIG. 19 is a diagram showing detailed structures of the battery monitor apparatus, and power generation control device included in the variant shown in FIG. 18.

FIG. 19 is a diagram showing detailed structures of the battery monitor apparatus 6B, and power generation control device 4A included in this variant. The battery monitor apparatus 6B shown in FIG. 19 differs in structure from the battery monitor apparatus 6 shown in FIG. 2 in that it is added with a indicator light signal transmitter 89. The indicator light signal transmitter 89 transmits an indicator light signal in accordance with a command from the microcomputer 64. The ECU 1A shown in FIG. 19 differs in structure from the ECU 1 shown in FIG. 2 in that it is added with an indicator light signal receiver 93, a PWM processor 94, and a display processor 95. The indicator light signal receiver 93 receives the indicator light signal transmitted from the battery monitor apparatus 6B. Upon receiving the indicator light signal of high level, the PWM processor 94 generates a notification signal by PWM-modulating this signal. The display processor 95 causes the indicator light 7 to light or blink in accordance with the notification signal.

FIG. 20 is a flowchart showing the operation of the battery monitor apparatus 6B show in FIG. 19. This operation differs the operation shown in FIG. 4 in that steps S201 and S203 are respectively changed to steps S201B and S203B. In the operation shown in FIG. 4, the destination of the high or low level indicator light signal transmitted at step S203 or step S201 is the power generation control device 4. On the other hand, in the operation shown in FIG. 19, the destination of the high or low level indicator light signal transmitted at step S203B or step S201B is the ECU 1A.

The above explained preferred embodiments are exemplary of the invention of the present application which is described solely by the claims appended below. It should be understood that modifications of the preferred embodiments may be made as would occur to one of skill in the art.

What is claimed is:

1. A vehicle-use battery monitor apparatus, comprising:
  a first function of receiving a power generation rate indicative of an operating state of a vehicle alternator driven by a vehicle engine mounted on a vehicle from a power generation control device mounted on said vehicle alternator to control an output of said vehicle alternator;
  a second function of detecting a charge/discharge current of a vehicle battery charged by said vehicle alternator;
  a third function of transmitting said power generation rate to an electronic control unit for controlling an output power of said vehicle engine in order that an idle-up control is performed depending on a value of said power generation rate;

a fourth function of increasing said value of said power generation rate to be transmitted to said electronic control unit when it is determined that said vehicle battery is in a discharge state on the basis of a detection result by said second function; and a fifth function of generating a notification signal in accordance with which an indicator light makes an indication of said power generation rate being increased by said forth function.

2. The vehicle-use battery monitor apparatus according to claim 1, wherein, when said power generation rate is increased by said fourth function, said power generation rate is transmitted to said electronic control unit from said third function after said indicator light makes said indication.

3. The vehicle-use battery monitor apparatus according to claim 1, wherein said indicator light is driven to make said indication by said power generation control device, said notification signal being transmitted from said vehicle-use battery monitor apparatus to said power generation control device.

4. The vehicle-use battery monitor apparatus according to claim 1, further comprising a sixth function of driving said indicator light in accordance with said notification signal.

5. The vehicle-use battery monitor apparatus according to claim 1, wherein said indicator light is driven to make said indication by said electronic control unit, said notification signal being transmitted to said electronic control unit from said vehicle-use battery monitor apparatus.

6. The vehicle-use battery monitor apparatus according to claim 1, wherein said indication is made by causing said indicator light to blink, darken, gradually lighten, or gradually darken.

7. The vehicle-use battery monitor apparatus according to claim 1, wherein a luminescent color of said indicator light is different from red.

8. The vehicle-use battery monitor apparatus according to claim 1, wherein said vehicle battery is determined to be in a discharge state when a discharge current of said vehicle battery detected by said second function is larger than a predetermined threshold current which is smaller than an operating current of an air conditioning apparatus mounted on said vehicle.

9. The vehicle-use battery monitor apparatus according to claim 1, further comprising a sixth function of determining a load response control time which defines a time period needed for completion of increase of said power generation rate by said fourth function such that said load response control time becomes longer as a discharge current of said vehicle battery detected by said second function increases, said sixth function transmitting said load response control time to said power generation control device in order that an increase rate of a power generation amount of said vehicle alternator is controlled in accordance with said load response control time.

10. The vehicle-use battery monitor apparatus according to claim 1, further comprising a sixth function of detecting an increase rate of a rotation speed of said vehicle alternator, and a seventh function of determining a load response control time which defines a time period needed for completion of increase of said power generation rate by said fourth function such that said load response control time becomes longer as said increase rate of said rotation speed of said vehicle alternator detected by said sixth function increases, said seventh function transmitting said load response control time to said power generation control device in order that an increase rate of a power generation amount of said vehicle alternator is controlled in accordance with said load response control time.

11. The vehicle-use battery monitor apparatus according to claim 1, further comprising a sixth function of detecting a temperature of said vehicle battery, and a seventh function of determining a load response control time which defines a time period needed for completion of increase of said power generation rate by said fourth function such that said load response control time becomes longer as a temperature of said vehicle battery detected by said sixth function lowers, said seventh function transmitting said load response control time to said power generation control device in order that an increase rate of a power generation amount of said vehicle alternator is controlled in accordance with said load response control time.

12. The vehicle-use battery monitor apparatus according to claim 11, wherein said second function and said sixth function are located near said vehicle battery, and transmission of said power generation rate and said load response control time between said vehicle-use battery monitor apparatus and said power generation control device is performed through digital communication.

* * * * *